(12) United States Patent
Wang

(10) Patent No.: US 8,988,104 B2
(45) Date of Patent: Mar. 24, 2015

(54) MULTIPLE-TIME CONFIGURABLE NON-VOLATILE LOOK-UP-TABLE

(71) Applicant: FlashSilicon Incorporation, Diamond Bar, CA (US)

(72) Inventor: Lee Wang, Diamond Bar, CA (US)

(73) Assignee: FlashSilicon Incorporation, Diamond Bar, CA (US)

( * ) Notice: Subject to any disclaimer, the term of this patent is extended or adjusted under 35 U.S.C. 154(b) by 53 days.

(21) Appl. No.: 13/778,784

(22) Filed: Feb. 27, 2013

(65) Prior Publication Data

US 2014/0239999 A1 Aug. 28, 2014

(51) Int. Cl.
*H03K 19/173* (2006.01)
*G11C 11/34* (2006.01)

(52) U.S. Cl.
CPC .................................. *H03K 19/173* (2013.01)
USPC ............ 326/38; 326/39; 326/41; 365/185.01; 365/185.14; 365/185.24; 365/185.33

(58) Field of Classification Search
USPC ......... 326/38–41; 365/185.01, 185.05, 185.1, 365/185.14, 185.18, 185.24, 185.25, 365/185.26, 185.28, 185.29, 185.33
See application file for complete search history.

(56) References Cited

U.S. PATENT DOCUMENTS

| | | | |
|---|---|---|---|
| 5,301,150 A | 4/1994 | Sullivan et al. | |
| 5,504,706 A | 4/1996 | D'Arrigo et al. | |
| 5,847,993 A * | 12/1998 | Dejenfelt | 365/185.1 |
| 6,191,980 B1 | 2/2001 | Kelley et al. | |
| 6,317,349 B1 * | 11/2001 | Wong | 365/49.15 |
| 6,329,240 B1 | 12/2001 | Hsu et al. | |
| 6,696,724 B2 | 2/2004 | Verhaar | |
| 7,019,353 B2 | 3/2006 | Lindsay et al. | |
| 7,129,748 B1 * | 10/2006 | McCollum et al. | 326/40 |
| 7,443,198 B1 * | 10/2008 | McCollum et al. | 326/40 |
| 7,522,453 B1 * | 4/2009 | Wang et al. | 365/185.11 |
| 7,590,000 B2 * | 9/2009 | McCollum et al. | 365/185.08 |
| 7,800,156 B2 | 9/2010 | Roizin et al. | |
| 7,816,747 B2 * | 10/2010 | Morf et al. | 257/428 |
| 7,969,188 B2 * | 6/2011 | Wang | 326/49 |
| 8,274,310 B2 * | 9/2012 | Wang | 326/49 |
| 8,633,548 B2 * | 1/2014 | Dhaoui et al. | 257/371 |
| 2011/0157974 A1 | 6/2011 | Lee et al. | |
| 2012/0299079 A1 | 11/2012 | Wang | |

OTHER PUBLICATIONS

Ohsaki, et al., "A Single Poly EEPROM Cell Structure for Use in Standard CMOS Processes", IEEE Journal of Solid-State Circuits, vol. 29, No. 3, Mar. 1994 pp. 311-316.

* cited by examiner

*Primary Examiner* — Vibol Tan
(74) *Attorney, Agent, or Firm* — Muncy, Geissler, Olds & Lowe, P.C.

(57) ABSTRACT

Innovative Non-Volatile Look-Up-Table (NV-LUT) has been constructed by Single Gate Logic Non-Volatile Memory (SGLNVM) devices processed with the standard CMOS logic process. One of a pair of complementary SGLNVM devices is always programmed to the high threshold voltage state and the other remains in the low threshold voltage state. By applying digital voltage rail ($V_{DD}$ and $V_{SS}$) to the input nodes of the pair of complementary SGLNVM devices, the output node of the pair of complementary SGLNVM devices outputs digital signals according to its configuration. The NV-LUT outputs digital signals from a plurality of pairs of complementary SGLNVM devices through a digital switching multiplexer. The NV-LUT is a good substitution for SRAM based LUT commonly used in Field Programmable Gate Array (FPGA).

13 Claims, 6 Drawing Sheets

MULTIPLE-TIME CONFIGURABLE NON-VOLATILE LOOK-UP-TABLE

BACKGROUND OF THE INVENTION

1. Field of the Invention

This invention is related to the Look-Up-Table (LUT) in Logic Element (LE), the basic building block for Field Programmable Gate array (FPGA). In particular, the configuration data for the Non-Volatile LUT (NV-LUT) of the invention are non-volatile in contrast to the conventional SRAM based volatile LUT. In comparison with the Complex Programmable Logic Device (CPLD) having separated on-chip non-volatile memory units for storing configuration data, the NV-LUT of the invention stores non-volatile configuration data in each LE unit for direct accessing in configurable digital circuitries.

2. Description of the Related Art

FPGA has been broadly applied for configuring digital circuitries. FPGA is more economical than ASIC (Application Specific Integrated Circuit) for digital circuit development especially in advanced technology nodes for their pricy mask set and process costs. The demands for higher logic gate counts and performance have been driving FPGA toward the advanced process technology nodes. The combination logic functions are configured with the SRAM-based LUTs in Logic Elements (LEs) in FPGA. Application specific functions of digital circuitries are accomplished by connecting the multiple configured LEs through interconnection matrixes in FPGA. Since the SRAM-based LUTs are volatile the configurations are lost after power off. The applications of FPGA are required to have non-volatile memory for storing non-volatile configuration data and to load back to the SRAM cells in the LUTs after turning on the FPGA chip. FPGA (low LE counts) integrated with on-chip non-volatile memory units is the CPLD. In contrast to the development of FPGA for large numbers of LEs processed with the state of art nano-meter CMOS technology, CPLD has stayed in low LE numbers for the sub-micron process technology. The main reason for CPLD lagging far behind the FPGA development is due to lack of cost effective and scalable non-volatile memory devices available for digital circuitries processed with the standard CMOS technology.

Furthermore since the conventional embedded NVM cells for storing configuration data used in CPLD are arranged in separated arrays fetching the configuration data requires sensing circuitry to convert NVM current signals into the digital signals and to write the converted digital signals into the SRAM cells in each LE. The data fetching and loading processes not only consume more chip power but also slow down the chip initialization speed. The requirements for NVM sensing circuitry and SRAM writing circuitry for non-volatile configuration data loading also economically hinder direct incorporating NVM devices in each LE unit. With the applications of complementary NVM devices (U.S. patent application Ser. Nos. 13/399,753 and 13/454,871, the disclosures of which are incorporated herein by reference in their entirety), a pair of complementary SGLNVM devices can store non-volatile digital data and direct output the digital signals without going through sensing amplifiers. Capable of outputting digital data signals direct from plural pairs of complementary SGLNVM devices storing non-volatile configuration data makes a fully integrated NV-LUT possible.

For the completion of the configurable digital circuitries, the configurable interconnection matrix using SGLNVM devices processed with standard CMOS logic process has been disclosed (U.S. patent application Ser. No. 13/683,721, the disclosure of which is incorporated herein by reference in its entirety).

In summary, we have demonstrated the new invention of NV-LUT using SGLNVM devices processed with standard CMOS logic process. Without adding process cost we have provided good solutions for configurable digital circuitries in the following aspects: 1) NV-LUT omits the requirement of non-volatile memory for non-volatile configuration data storage; 2) NV-LUT has faster circuit initialization speeds and less power consumption from the saving of external configuration loading; 3) NV-LUT is multiple-time configurable (proven 20 k-time configurations for the SGLVNM devices fabricated by a foundry); 4) NV-LUT is scalable according to the standard logic process technology nodes. The NV-LUT of the invention can meet the demands for high logic gate counts and high performance in configurable digital circuitries from the benefits of the advanced logic process technology.

SUMMARY OF THE INVENTION

In this invention we have substituted the volatile LUT SRAM cells with the novel Single Gate Logic NVM (SGLNVM) cell devices to form Non-Volatile LUT (NV-LUT) in the LE, the basic FPGA building block. The scalable SGLNVM devices processed with the standard CMOS logic process are the non-volatile memory using the minimal logic gate length as the floating gate for charge storage with control gates embedded in the P-type substrate. The minimal SGLNVM device size of 0.2157 μm$^2$ has been demonstrated with foundry's standard 55 nm CMOS logic process. The threshold voltages of SGLNVM devices are shifted to a higher voltage state after programmed by injecting electrons to the single floating gate while the threshold voltages of SGLNVM devices can be erased to a low voltage state by removing the electrons from the floating gates or slightly injecting holes in the floating gates. Examples of the programmed and erased SGLNVM device characteristic curves are shown in FIGS. 1a and 1b.

The schematic of a pair 200 of complementary SGLNVM cell devices 210 and 220 is shown in FIG. 2. The two drain electrodes 211 and 221 of complementary SGLNVM devices 210 and 220 are the two input nodes to be applied with digital voltage rail ($V_{DD}$ and $V_{SS}$) for read and with the voltage bias $V_{DH}$ for programming. The common source electrode of the pair 200 of complementary SGLNVM devices is the output node 230 for the digital signals. The common control gates 240 of the complementary devices are applied with voltage biases for reading, programming, and erasing. Storing a non-volatile bit in NV-LUT is accomplished by a pair 200 of complementary SGLNVM cell devices. In respect of the pair 200 of complementary SGLNVM devices, one device 210 is programmed to the high threshold voltage state $V_{tH}$ while the other device 220 remains in the low threshold voltage state $V_{tL}$ for storing a digital "0". For storing a digital "1", one device 220 of the pair 200 of complementary SGLNVM devices is programmed to the high threshold voltage state while the other device 210 remains in the low threshold voltage state. In normal operation mode, the digital voltage rail $V_{DD}$ and $V_{SS}$ are applied to the input nodes 211 and 221, respectively. With the applied control gate voltage $V_{CG}$ lower than the high threshold voltage $V_{tH}$ and higher than the low threshold voltage ($V_{tL}+V_{DD}$) to the control gate 240, the pair 200 of complementary SGLNVM devices passes the digital signals either $V_{DD}$ ("1") or $V_{SS}$ ("0") at the output node 230.

An N-bit LUT 300 includes $2^N$ pairs of complementary SGLNVM cell devices 200 and an N-bit digital switching multiplexer 350 as shown in FIG. 3. The control gates 240 of the $2^N$ pairs 200 of complementary SGLNVM cells form a single control gate line 340 to be applied with the same voltage biases for reading, programming, and erasing. The common source electrodes 230 of the complementary pairs are the output nodes 230 connected to the data input nodes 351 of the N-bit digital switching multiplexer 350. With the two electrodes 211 and 221 of each complementary pair 200 biased with $V_{DD}$ and $V_{SS}$ respectively for all the $2^N$ pairs, the control gate line 340 is biased with the control gate voltage bias $V_{CG}$, where $V_{tH} > V_{CG} > (V_{tL} + V_{DD})$, to cause the complementary pairs 200 to output the digital signals. The digital signal input nodes 355 of the N-bit digital switching multiplexer receive N-bit digital signals to turn on a corresponding switch to connect one of the data input nodes 351 to the output node 352. The N signal input bits (at nodes 355) act like the address code for accessing the non-volatile digital contents in the $2^N$ pairs of complementary SGLNVM cells 200.

BRIEF DESCRIPTION OF THE DRAWINGS

For a better understanding of the present invention and to show how it may be carried into effect, reference will now be made to the following drawings, which show the preferred embodiment of the present invention, in which.

DETAILED DESCRIPTION OF THE INVENTION

The following detailed description is meant to be illustrative only and not limiting. It is to be understood that other embodiment may be utilized and element changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

Figure 1A:
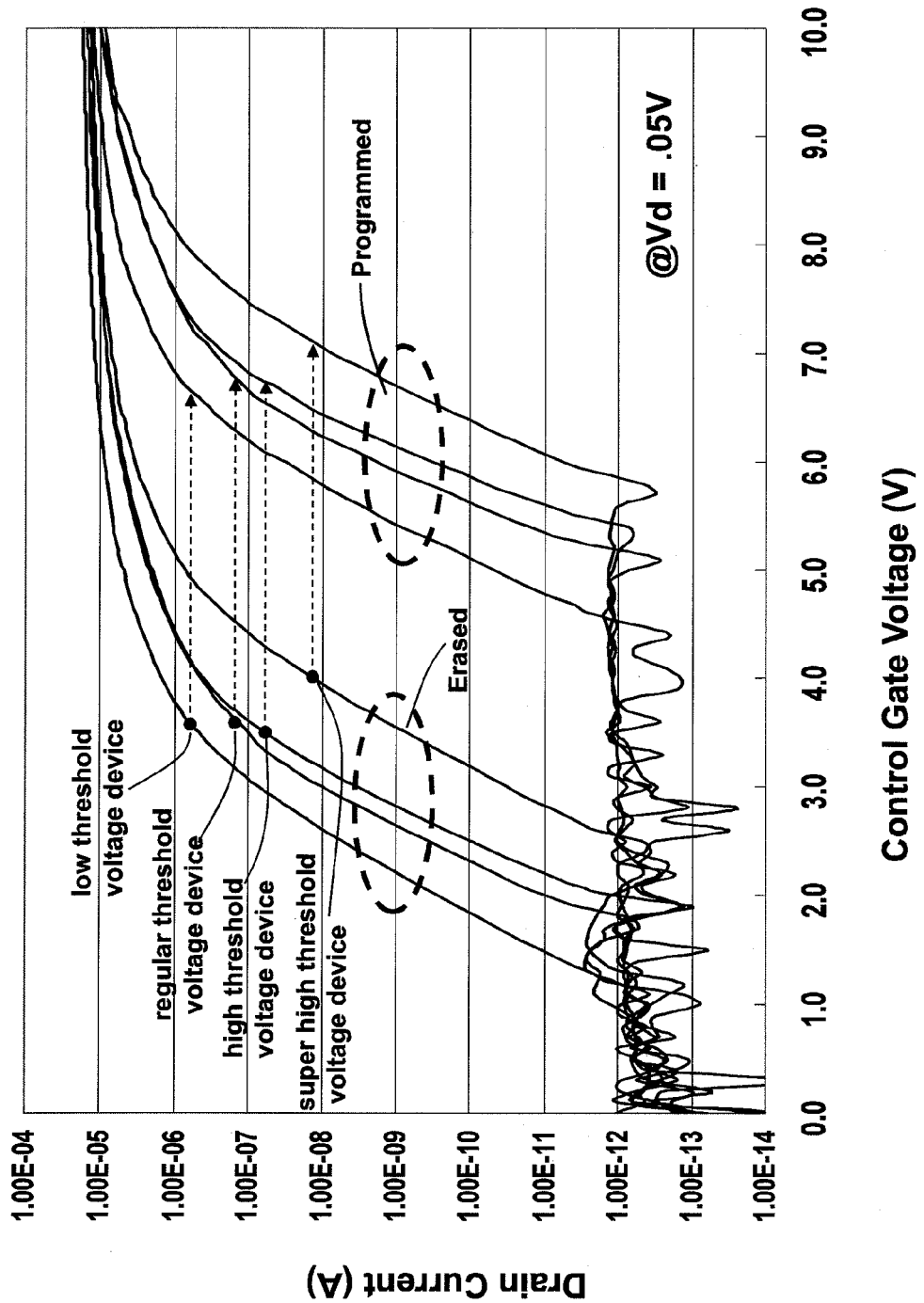
FIG. 1a shows the examples of SGLNVM device characteristic curves with drain voltage bias at 0.05V in logarithm scale processed with foundry's standard 55 nm CMOS logic process.
Figure 1B:
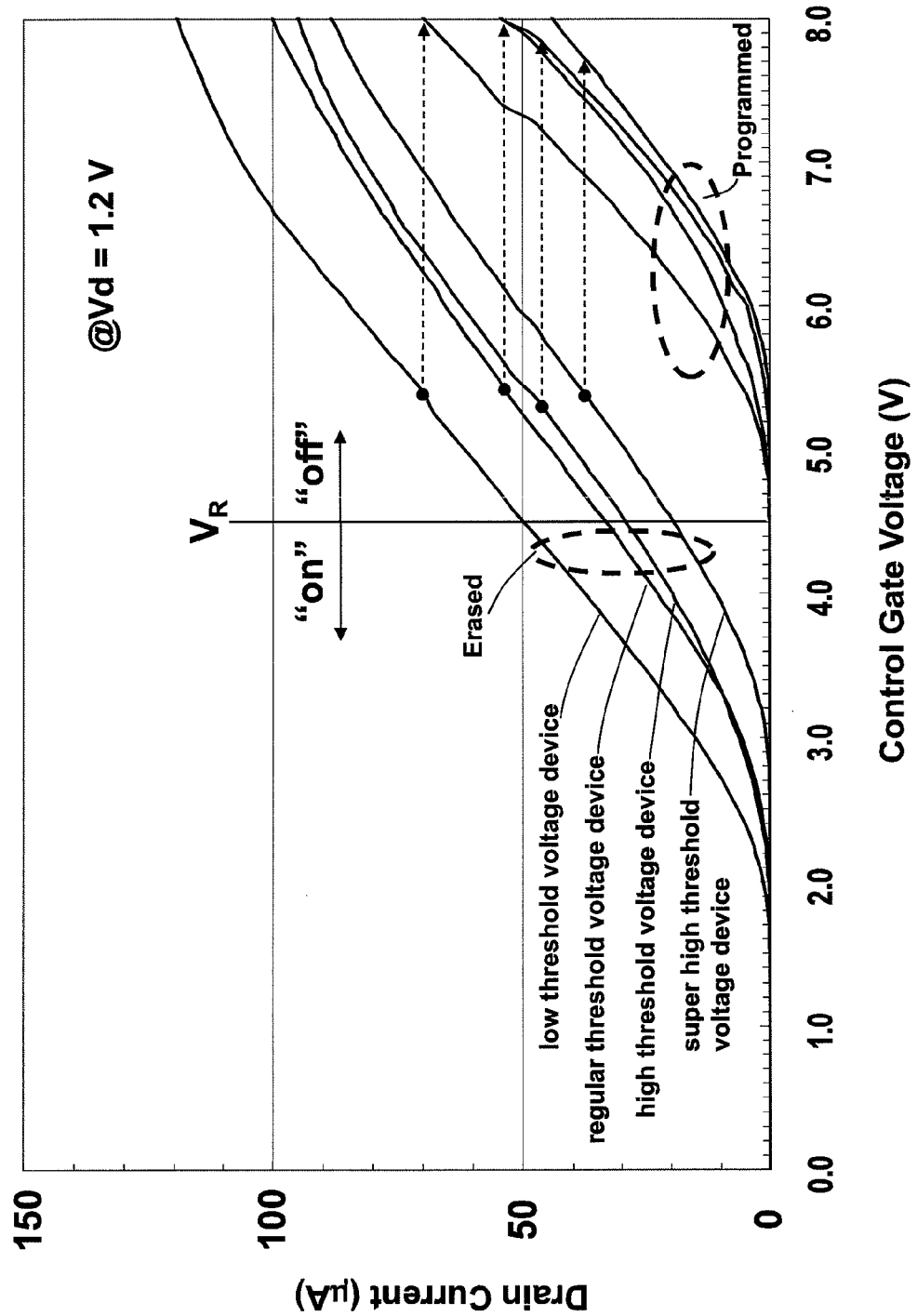
FIG. 1b shows the examples of SGLNVM device characteristic curves with drain voltage bias at $V_{DD}$=1.2 V in linear scale processed with foundry's standard 55 nm CMOS logic process.
Figure 2:
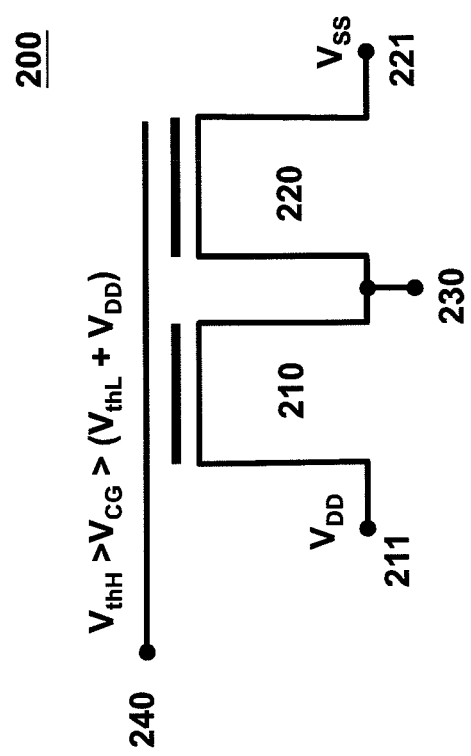
FIG. 2 shows the schematic for a pair of complementary SGLNVM devices according to an embodiment the invention.
Figure 3:
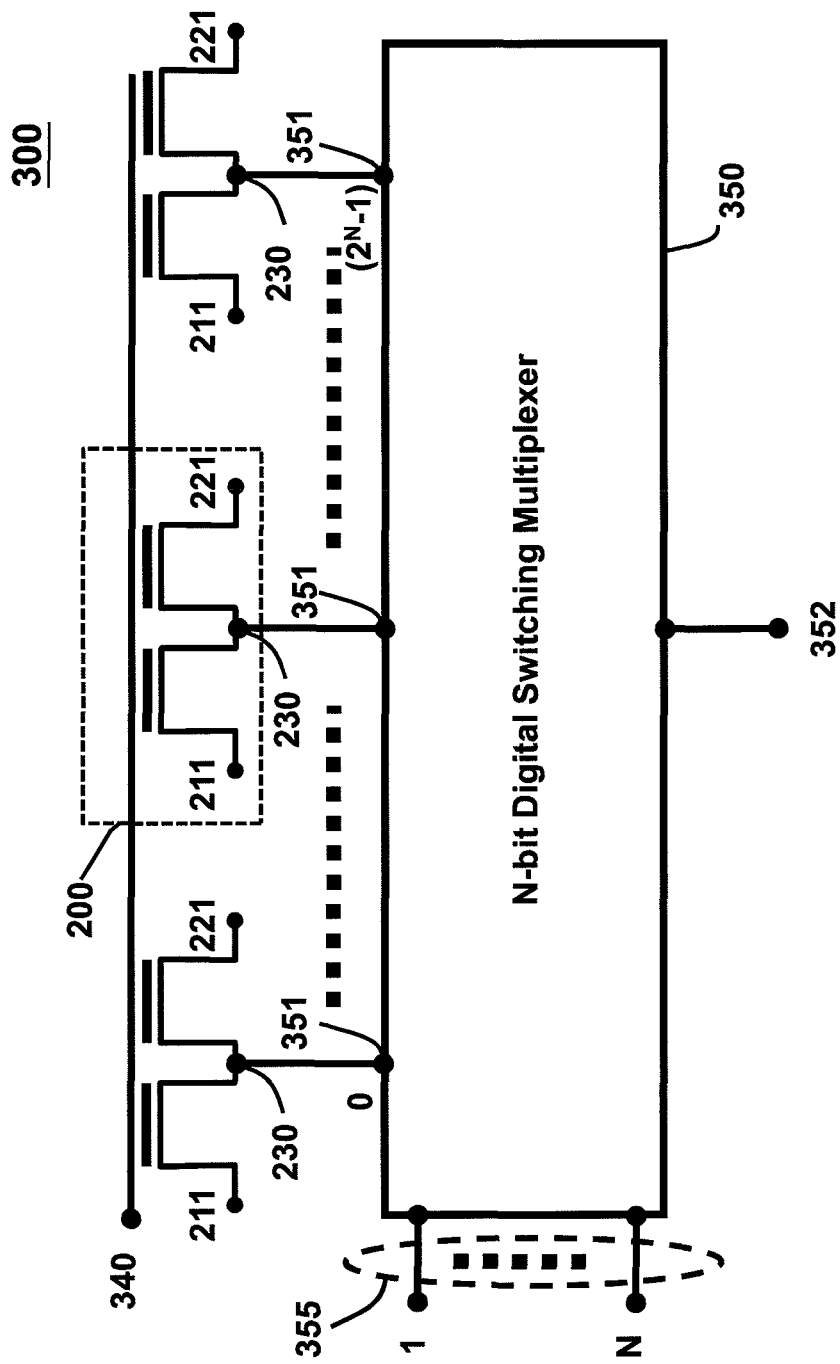
FIG. 3 shows the schematics of N-bit Non-Volatile Look-Up-Table (NV-LUT) including $2^N$ pairs of complementary SGLNVM devices and N-bit digital switching multiplexer according to one embodiment of the invention.
Figure 4:
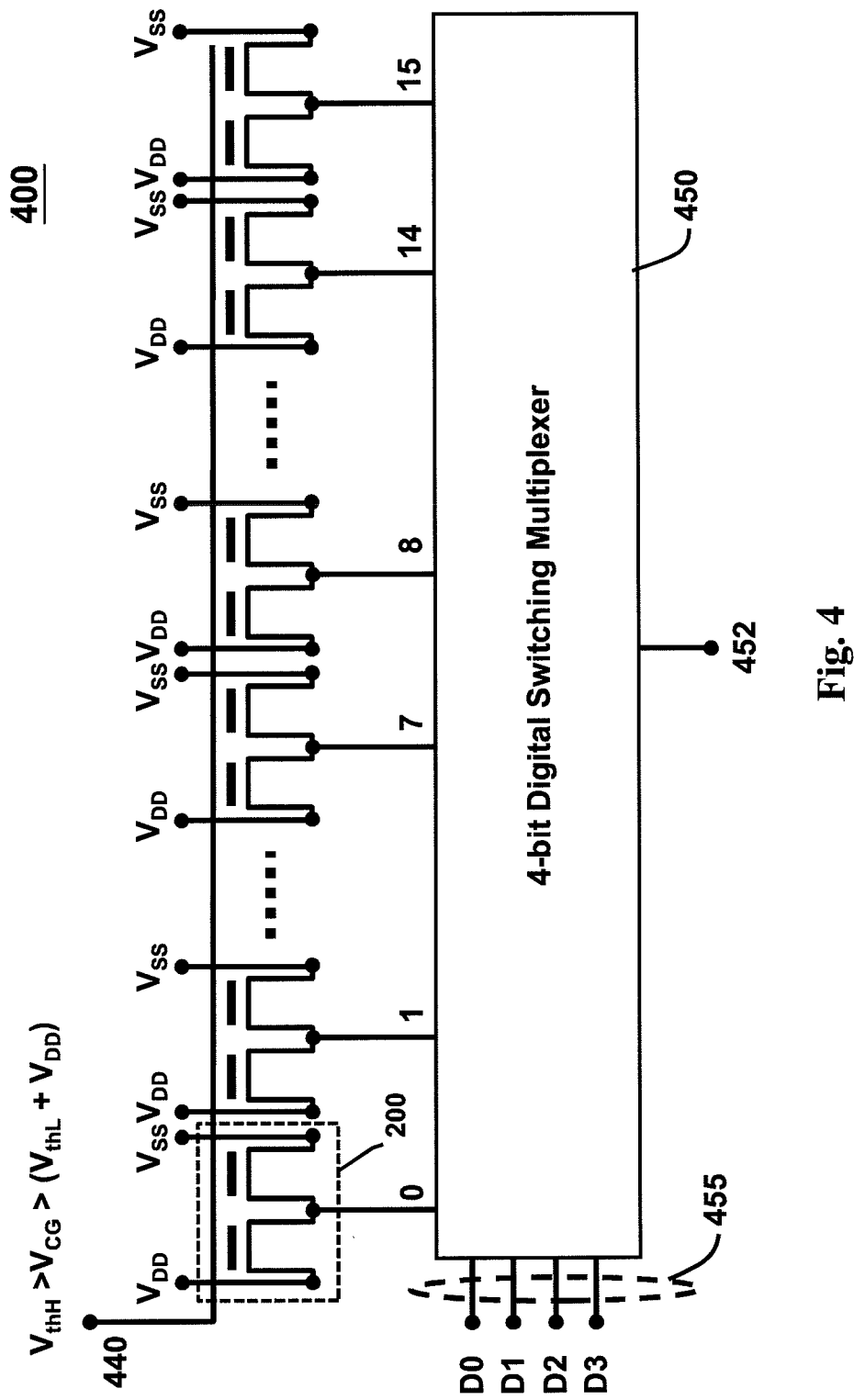
FIG. 4 shows a 4-bit NV-LUT according to one embodiment of the invention.

The 4-bit LUT is the standard configuration unit in LE in FPGA. Depending on the various architectures from different vendors for combination logic and arithmetic operations, an LE could consist of 1~4 LUTs, control switches, and one D-flip flop for storing static memory bit. In the preferred embodiment, we have constructed a 4-bit NV-LUT 400 using 16 pairs (200) of N-type complementary SGLNVM cell devices and a 4-bit digital switching multiplexer 450 as shown in FIG. 4. The 16 pairs (200) of N-type complementary SGLNVM cells in 4-bit NV-LUT 400 have been substituted for the 16 bits of SRAM cells in the conventional 4-bit LUT.

Before configuring the NV-LUTs 400, all the SGLNVM cell devices on the chip are initially erased to the low threshold voltage state $V_{tL}$ by the conventional Fowler-Nordheim tunneling method. In configuring the NV-LUTs 400, a high voltage pulse with amplitudes of several volts is applied to the selected control gate line 440 for several micro-seconds with a programming voltage $V_{DH}$ (3.5V~5V) biased to the drain electrodes of the selected programming SGLNVM cell devices. The configuration for a 4-bit NV-LUT 400 is done by programming all the 16 pairs of complementary SGLNVM cell devices (32 SGLNVM cell devices) in parallel. To form the complementary pairs (one in the programmed high voltage state $V_{tH}$ and the other in the erased low voltage state $V_{tL}$), one half of the 32 SGLNVM cell devices are thus programmed to the high threshold voltage state $V_{tH}$ and the other half of the 32 SGLNVM cell devices remain in the low threshold voltage state $V_{tL}$ for the 4-bit NV-LUT. Each 4-bit NV-LUT in plural LEs of the Non-Volatile FPGA (NV-FPGA) can be individually configured according to the specific requirements of digital circuitries.

Figure 5:
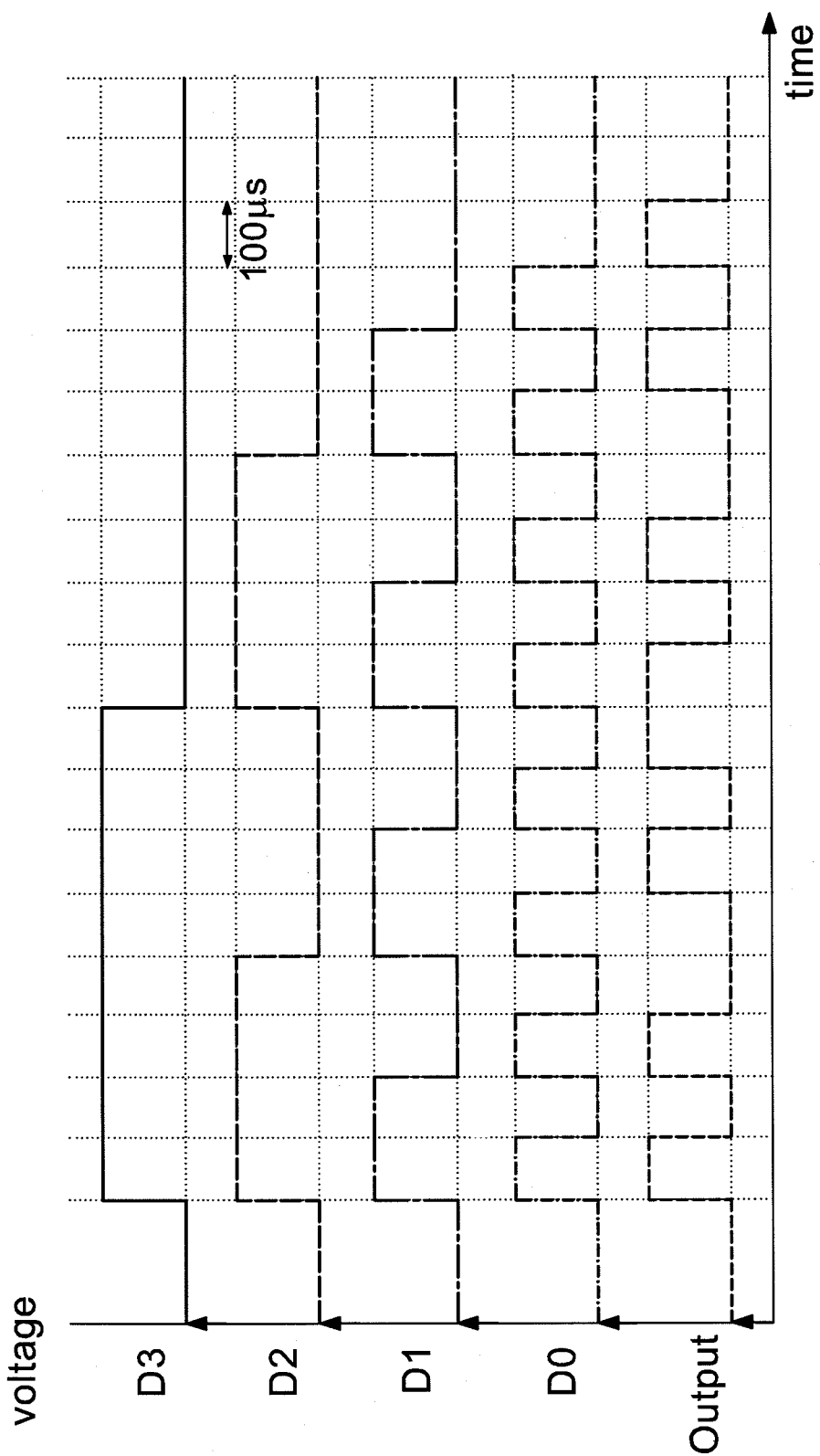
FIG. 5 shows the digital output signals (from node 452) of a 4-bit NV-LUT for a pre-configured codes of "1010010110100101 (A5A5h)" by decrementally varying 4-bit input signals at nodes 455 from "1111" to "0000" according to one embodiment of the invention.

In normal operation mode after configuration, all the pairs 200 of complementary SGLNVM cells are biased to the digital voltage rail $V_{DD}$ and $V_{SS}$ respectively. A control gate voltage bias $V_{CG}$, where $V_{tH} > V_{CG} > (V_{tL} + V_{DD})$, is applied to the control gate lines 450 to output the digital signals, $V_{DD}$ "1" and $V_{SS}$ "0", from the NV-LUTs 400 in LEs. FIG. 5 shows a pre-programmed pattern of the digital output signals (at node 452) from the 16 pairs of complementary SGLNVM cells 200 of a 4-bit NV-LUT 400 by decrementally changing the 4 input bits (at nodes 455) from "1111" to "0000" in the embodiment.

Please note that the pairs 200 of complementary SGLNVM cell devices in the above embodiments are provided by way of examples and not limitations of the invention. In an alternative embodiment, the pairs 200 of complementary SGLNVM cell devices can be replaced with pairs of complementary NVM cell devices of other types.

The aforementioned description of the preferred embodiments of the invention has been presented for purposes of illustration and description. It is not intended to be exhaustive or to limit the invention to the precise form or to exemplary embodiments disclosed. Accordingly, the description should be regarded as illustrative rather than restrictive. Obviously, many modifications and variations of non-volatile memory elements including the types of non-volatile memory device made of different non-volatile material and the types of reset transistors will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A multiple-time configurable non-volatile look-up-table (NV-LUT) for receiving an N-bit input signal and generating an output bit, the NV-LUT comprising:
   $2^N$ pairs of non-volatile memory (NVM) cells, each NVM cell having a source, a drain, a floating gate, a control gate and a channel region, each pair of NVM cells sharing a corresponding common source, the control gates of the $2^N$ pairs of NVM cells being connected together, each pair of NVM cells being configured into an erased cell and a programmed cell after each configuration cycle; and
   a switching unit coupled to the $2^N$ common sources of the $2^N$ pairs of NVM cells for selecting one from $2^N$ logic values at the $2^N$ common sources for output as the output bit according to the N-bit input signal;
   wherein in a normal operation mode, each pair of NVM cells has a first drain coupled to an operating voltage terminal, a second drain coupled to a ground terminal and its common source generating the logic value that corresponds to a voltage carried by one of the two terminals coupled to a turned on cell when the control gates are biased.

2. The non-volatile look-up-table according to claim 1, which is applied to a logic element (LE) of a Field Programmable Gate Array (FPGA).

3. The non-volatile look-up-table according to claim 1, wherein in the normal operation mode, when the NVM cells are N-type, a control gate voltage $V_{CG}$ is applied to the control gates of the $2^N$ pairs of NVM cells and $(V_{tL}+V_{DD})<V_{CG}<V_{tH}$, wherein $V_{tL}$ and $V_{tH}$ respectively denote a low threshold voltage and a high threshold voltage of the NVM cells, and wherein $V_{DD}$ denotes an operating voltage.

4. The non-volatile look-up-table according to claim 1, wherein the erased cell in a low threshold voltage state is turned on and the programmed cell in a high threshold voltage state is turned off for each pair of NVM cells in the normal operation mode when the NVM cells are N-type.

5. The non-volatile look-up-table according to claim 1, wherein all the NVM cells are erased to a low threshold voltage state before each configuration cycle.

6. The non-volatile look-up-table according to claim 1, wherein the $2^N$ pairs of NVM cells are configured in parallel during each configuration cycle.

7. The non-volatile look-up-table according to claim 6, wherein during each configuration cycle, a high voltage pulse is applied to the control gates of the $2^N$ pairs of NVM cells and a programming high voltage is applied to the drain of a selected NVM cell of each pair of NVM cells when the NVM cells are N-type.

8. The non-volatile look-up-table according to claim 1, wherein the switching unit is an N-bit digital switching multiplexer.

9. A method of providing an output bit from a multiple-time configurable non-volatile look-up-table (NV-LUT) in response to an N-bit input signal, the NV-LUT comprising $2^N$ pairs of non-volatile memory (NVM) cells and a switching unit, each NVM cell having a source, a drain, a floating gate, a control gate and a channel region, each pair of NVM cells sharing a corresponding common source, the control gates of the $2^N$ pairs of NVM cells being connected together, the method comprising:
   coupling a first drain to an operating voltage terminal and a second drain to a ground terminal for each pair of NVM cells after configuration;
   applying a control gate voltage to the control gates of the $2^N$ pairs of NVM cells after configuration such that one cell is turned on and the other cell is turned off for each pair of NVM cells after configuration; and
   selecting one from $2^N$ logic values at the $2^N$ common sources of the $2^N$ pairs of NVM cells after configuration for output as the output bit by the switching unit in response to the N-bit input signal;
   wherein the logic value at the common source corresponds to a voltage carried by one of the two terminals coupled to the turned on cell for each pair of NVM cells after configuration; and
   wherein one cell is in a low threshold voltage state and the other cell is in a high threshold voltage state for each pair of NVM cells after configuration.

10. The method according to claim 9, wherein when the NVM cells are N-type, the control gate voltage is greater than $(V_{tL}+V_{DD})$ and less than $V_{tH}$, wherein $V_{tL}$ and $V_{tH}$ respectively denote a low threshold voltage and a high threshold voltage of the NVM cells, and wherein $V_{DD}$ denotes an operating voltage.

11. The method according to claim 9, further comprising:
   configuring the $2^N$ pairs of NVM cells in parallel before the steps of coupling, applying and selecting.

12. The method according to claim 11, wherein when the NVM cells are N-type, the step of configuring comprises:
   changing threshold voltages of all the NVM cells to a low threshold voltage state;
   applying a high voltage pulse to the control gates of the $2^N$ pairs of NVM cells; and
   applying a programming high voltage to the drain of a selected one of each pair of NVM cells.

13. The method according to claim 9, which is applied to a logic element (LE) of a Field Programmable Gate Array (FPGA).

* * * * *